US009502380B2

United States Patent
Lin et al.

(10) Patent No.: US 9,502,380 B2
(45) Date of Patent: Nov. 22, 2016

(54) THREE DIMENSIONAL INTEGRATED CIRCUITS STACKING APPROACH

(71) Applicant: Taiwan Semiconductor Manufacturing Co., Ltd., Hsin-Chu (TW)

(72) Inventors: Jing-Cheng Lin, Hsinchu (TW); Shang-Yun Hou, Jubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/959,094

(22) Filed: Dec. 4, 2015

(65) Prior Publication Data

US 2016/0086918 A1    Mar. 24, 2016

Related U.S. Application Data

(62) Division of application No. 13/630,149, filed on Sep. 28, 2012, now Pat. No. 9,209,156.

(51) Int. Cl.
*H01L 21/50* (2006.01)
*H01L 25/065* (2006.01)
(Continued)

(52) U.S. Cl.
CPC ......... *H01L 25/0652* (2013.01); *H01L 21/486* (2013.01); *H01L 21/4853* (2013.01); *H01L 21/561* (2013.01); *H01L 21/563* (2013.01); *H01L 21/568* (2013.01); *H01L 23/3128* (2013.01); *H01L 24/05* (2013.01); *H01L 24/20* (2013.01); *H01L 24/96* (2013.01); *H01L 24/97* (2013.01); *H01L 25/0657* (2013.01); *H01L 25/50* (2013.01); *H01L 21/6836* (2013.01);
(Continued)

(58) Field of Classification Search
CPC .......... H01L 2924/01078–2924/01079; H01L 2924/01029; H01L 23/5226; H01L 23/481
USPC ....... 438/125, 124, 126, 127, 613, 411, 109, 438/115, 116, 629, 637
See application file for complete search history.

(56) References Cited

U.S. PATENT DOCUMENTS 8,890,329 B2    11/2014  Kim et al.
2008/0157316 A1    7/2008  Yang
(Continued)

OTHER PUBLICATIONS

English translation of Decision of Refusal of Amendment dated Sep. 8, 2015 from corresponding No. KR 10-2012-0151681.
(Continued)

*Primary Examiner* — Hoa B Trinh
(74) *Attorney, Agent, or Firm* — Eschweiler & Associates, LLC

(57) ABSTRACT

A semiconductor package and a method of forming a semiconductor package with one or more dies over an interposer are provided. In some embodiments, the method is performed by placing an interposer with one or more through-substrate-vias (TSVs) on a first adhesive layer overlying a first carrier substrate. Connection structures are arranged along a first surface of the interposer facing the first adhesive layer. A first molding compound is formed over the first adhesive layer and surrounding the interposer. The first molding compound is arranged to expose the TSVs along a second surface of the interposer. A first redistribution structure is formed over the second surface of the interposer and the first molding compound, and conductive bump structures are formed over the first redistribution structure. A first packaged die is bonded to the conductive bump structures.

20 Claims, 8 Drawing Sheets

(51) Int. Cl.
*H01L 23/00* (2006.01)
*H01L 23/31* (2006.01)
*H01L 21/56* (2006.01)
*H01L 21/48* (2006.01)
*H01L 25/00* (2006.01)
H01L 21/683 (2006.01)
H01L 21/60 (2006.01)

(52) U.S. Cl.
CPC ............... *H01L24/13* (2013.01); *H01L 24/16* (2013.01); *H01L 24/81* (2013.01); *H01L 2021/6006* (2013.01); *H01L 2021/6024* (2013.01); *H01L 2224/0237* (2013.01); *H01L 2224/02331* (2013.01); *H01L 2224/02379* (2013.01); *H01L 2224/0401* (2013.01); *H01L 2224/04105* (2013.01); *H01L 2224/05024* (2013.01); *H01L 2224/05541* (2013.01); *H01L 2224/12105* (2013.01); *H01L 2224/131* (2013.01); *H01L 2224/13147* (2013.01); *H01L 2224/16145* (2013.01); *H01L 2224/16225* (2013.01); *H01L 2224/16227* (2013.01); *H01L 2224/17181* (2013.01); *H01L 2224/32227* (2013.01); *H01L 2224/73204* (2013.01); *H01L 2224/81024* (2013.01); *H01L 2224/96* (2013.01); *H01L 2224/97* (2013.01); *H01L 2225/06517* (2013.01); *H01L 2225/06541* (2013.01); *H01L 2225/06572* (2013.01); *H01L 2924/1305* (2013.01); *H01L 2924/1306* (2013.01); *H01L 2924/13091* (2013.01); *H01L 2924/181* (2013.01); *H01L 2924/351* (2013.01)

(56) References Cited

U.S. PATENT DOCUMENTS

| 2008/0157396 | A1 | 7/2008 | Yang |
| 2009/0102037 | A1 | 4/2009 | Kim |
| 2012/0211885 | A1 | 8/2012 | Choi et al. |
| 2013/0093073 | A1 | 4/2013 | Chen et al. |

OTHER PUBLICATIONS

English translation of Notice of Final Rejection dated Sep. 8, 2015 from corresponding No. KR 10-2012-0151681.
English translation of Office Action dated Jan. 27, 2015 from corresponding No. KR 10-2012-0151681.
Non-Final Office Action dated Oct. 24, 2014 for U.S. Appl. No. 13/630,149.
Non-Final Office Action dated Mar. 18, 2015 for U.S. Appl. No. 13/630,149.
Notice of Allowance dated Aug. 3, 2015 for U.S. Appl. No. 13/630,149.
U.S. Appl. No. 61/665,123, filed Jun. 27, 2012.
U.S. Appl. No. 13/619,877, filed Sep. 14, 2012.
U.S. Appl. No. 13/427,753, filed Mar. 22, 2012.
U.S. Appl. No. 13/338,820, filed Dec. 28, 2011.

THREE DIMENSIONAL INTEGRATED CIRCUITS STACKING APPROACH

REFERENCE TO RELATED APPLICATIONS

This Application is a Divisional of U.S. application Ser. No. 13/630,149 filed on Sep. 28, 2012. The contents of which are incorporated by reference in their entirety. In addition, the present application is related to U.S. provisional Application No. 61/665,123, entitled "3DIC Stacking Device and Method of Manufacture," filed on Jun. 27, 2012, and U.S. patent application Ser. No. 13/619,877, entitled "3DIC Stacking Device and Method of Manufacture," filed on Sep. 14, 2012. Both above-mentioned applications are incorporated herein by reference in their entireties.

BACKGROUND

With the continued evolution of semiconductor technologies, semiconductor chips/dies are becoming increasingly smaller. In the meantime, more functions are being integrated into the semiconductor dies. Accordingly, the semiconductor dies have increasingly greater numbers of input/output (I/O) pads packed into smaller areas. As a result, the packaging of the semiconductor dies becomes more important and more challenging.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on a surface of a semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are then bonded with the integrated circuits aligned. Through-substrate-vias (TSVs), also referred to as through-silicon-vias or through-wafer vias, are increasingly used as a way of implementing 3D ICs. TSVs are often used in 3D ICs and stacked dies to provide electrical connections and/or to assist in heat dissipation. There are challenges in forming TSVs in 3D ICs and stacked dies.

Figure 1A:
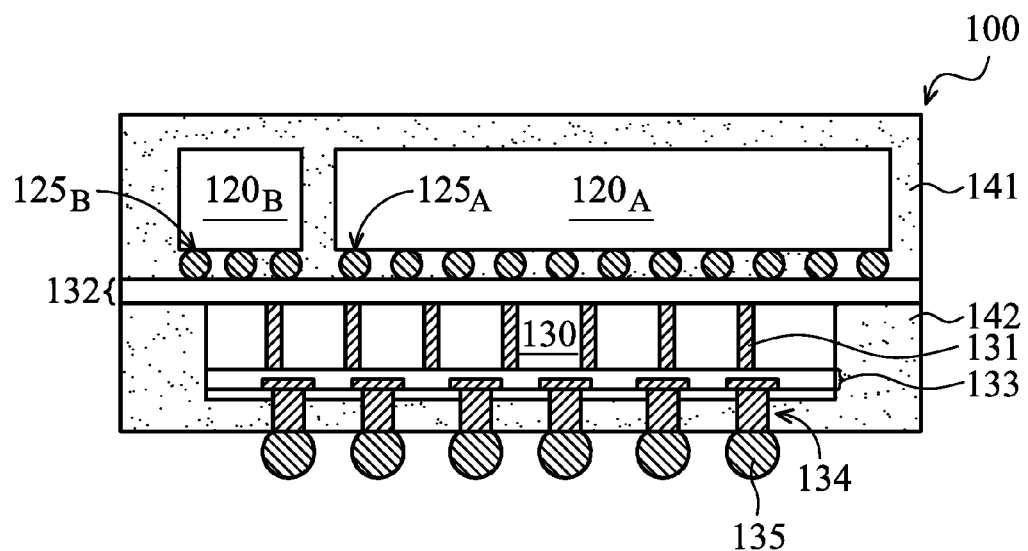
FIGS. 1A-1C show cross-sectional views of packages, in accordance with some embodiments.

FIG. 1A shows a cross-sectional view of a package 100, in accordance with some embodiments. Package 100 includes two semiconductor dies, $120_A$ and $120_B$, bonded to another semiconductor die 130. In some embodiments, each of the semiconductor dies, $120_A$ and $120_B$, includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements (not shown) that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements.

Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Die 130 includes TSVs 131. Die 130 may include various passive and active microelectronic devices (not shown), such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof. Die 130 is an interposer, which provides an electrical connection and/or to assist in heat dissipation in a 3-dimensional (3-D) package system, in accordance with some embodiments. Interposers with active devices may be referred to as active interposers. Interposers without active devices may be referred to as passive interposers.

Die 130 in FIG. 1A also includes redistribution structure 132. Redistribution structure 132 includes layers RDLs (or RDL, not shown) to enable fan-out for dies 130, $120_A$, and/or $120_B$. By enabling fan-out for die 130, die $120_A$ and/or $120_B$ can have edges beyond the edges of die 130, as shown in FIG. 1A.

Redistribution structure 132 also includes dielectric layer(s), which is protects and isolate RDLs. RDLs of redistribution structure 132 expand interconnection beyond the edges of dies 130, $120_A$, and/or $120_B$. Dies $120_A$ and $120_B$ are bonded to RDLs of die 130 via bonding structures $125_A$ and $125_B$ to make connections with TSVs 131. Die 130 has interconnect structure 133 on an opposite side of redistribution structure 132 to provide electrical connections between devices (not shown) of die 130, TSVs 131 and connection structures 134, which are connected to external connectors 135. In some embodiments, interconnect structure 133 includes metal lines and vias. External connectors 135 may be bonded to a substrate, such as a printed circuit board (PCB), or another package structure. Connection structures 134 are surrounded by a protective layer 145, in accordance with some embodiments. The protective layer 145 is made of a polymer, such as polyimide, polybenzoxazole (PBO), or benzocyclobutene (BCB), in some embodiments.

Exemplary structures of redistribution structures 132 and bonding structures $125_A$ and $125_B$, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 1B:
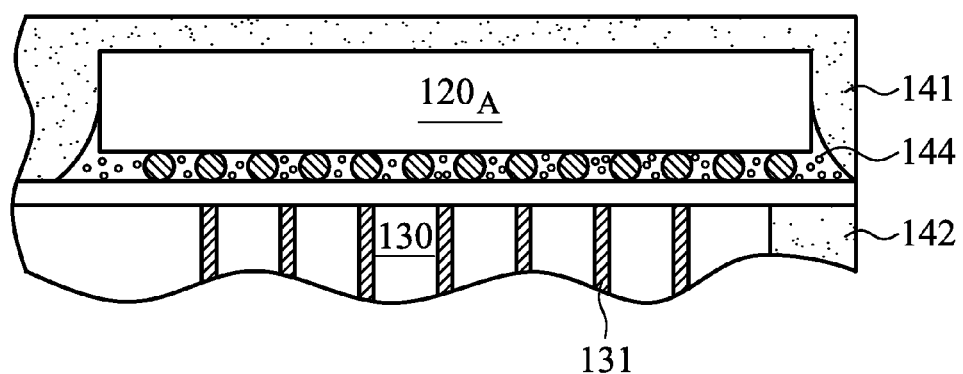

Dies $120_A$ and $120_B$ are covered by a molding compound 141 and die 130 is covered by a molding compound 142. In some embodiments, the molding compounds 141 and 142 include epoxy, silicon, silica filler, and/or other types of polymers. Molding compound 141 and molding compound 142 are made of the same material, in some embodiments. In some embodiments, there is an underfill between each of dies $120_A$ and $120_B$ and die 130. FIG. 1B shows an underfill 144 fills the space between die $120_A$ and redistribution structure 132 of die 130, in accordance with some embodiments. Underfill 144 may, for example, comprise a liquid epoxy that is dispensed to fill the space. The underfill material may be used to prevent cracks from being formed in and near bonding structures $125_A$, wherein cracks are typically caused by thermal stresses. Alternatively, either a deformable gel or silicon rubber could be formed between the die $120_A$ and die 130. This gel or silicon rubber may be formed by injecting or otherwise placing the gel or rubber between these two dies. The deformable gel or silicon rubber may also provide stress relief during subsequent processing. Underfill 144 can also be formed between dies $120_B$ and 130.

Figure 1C:
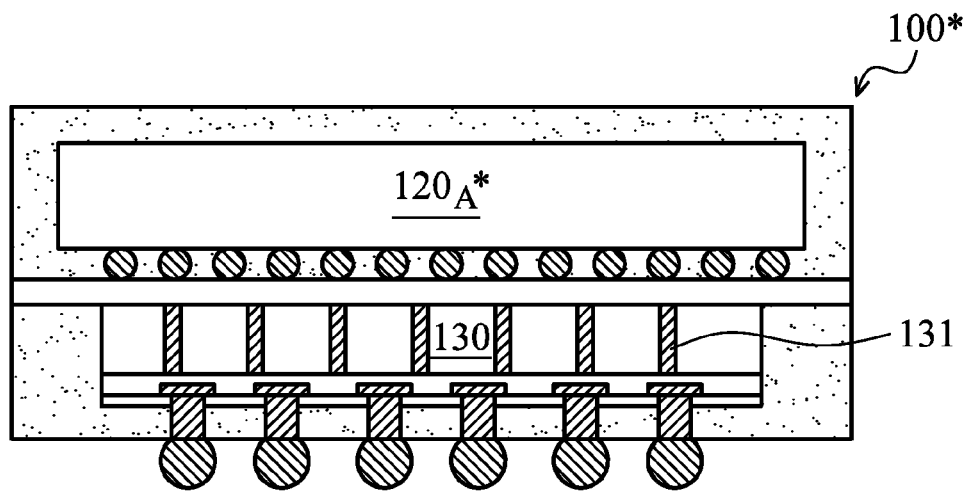

In some embodiments, the space between each of dies $120_A$ and $120_B$ and die 130 is filled by molding compound 141. Under such circumstance, molding compound 141 is a molding underfill (MUF). FIG. 1A shows two dies $120_A$ and $120_B$ are bonded to die 130 with TSVs 131. However, one die, such as $120_A$*, could be bonded to die 130 to form package 100*, as shown in FIG. 1C in accordance with some embodiments.

Figure 2:
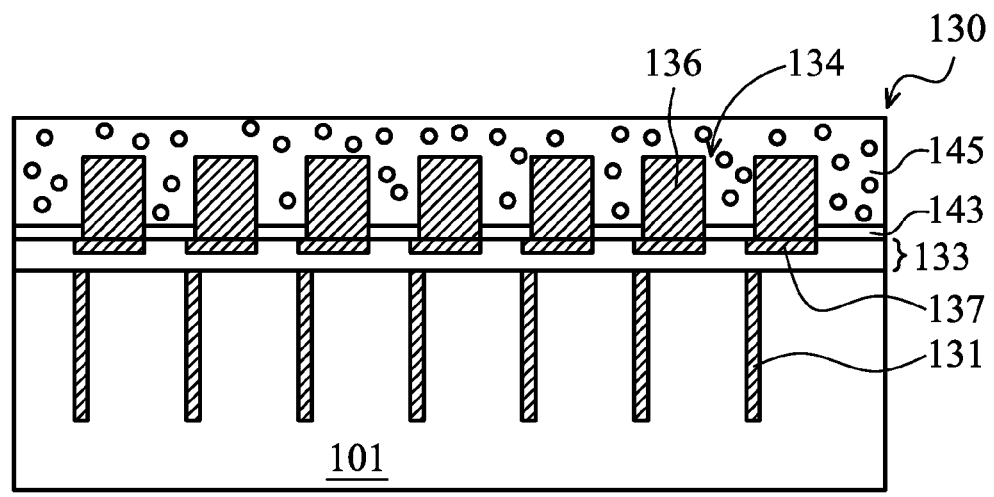
FIG. 2 shows a cross-sectional view of a die, in accordance with some embodiments.

FIG. 2 shows a cross-sectional view of die 130 before being bonded to other die(s), in accordance with some embodiments. FIG. 2 shows die 130 has TSVs 131 and connection structures 134, which are to be connected to external connectors 135, as described above. TSVs 131 are formed in substrate 101. Connection structures 134 may include metal post 136 over metal pad 137 and are insulated from one another by dielectric layer(s) 143, in accordance with some embodiments. Dielectric layer(s) 143 is made of polymers, such as polyimide, in some embodiments and can be call a passivation layer(s). Metal posts 136 could be made of copper, copper alloy, other types of metal, other types of metal alloy, or combination thereof. Metal pad 137 may be made of aluminum, aluminum alloy, copper, copper alloy, other types of metal, other types of alloy, or combination thereof. In some embodiments, there is an under bump metallurgy (UBM) layer (not shown) between metal pad 137 and metal posts 136. The UBM layer acts as a diffusion barrier layer between metal pad 137 and metal posts 136 and may also act as a plating-enabling layer.

Exemplary structures and methods of forming connection structures 134 are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

FIG. 2 shows that the metal post 136 and an exposed surface of die 130 next to metal post 136 are covered by the protective layer 145 described in FIG. 1A. In some embodiments, the protective layer 145 is made of a polymer, such as polyimide, polybenzoxazole (PBO), or benzocyclobutene (BCB). However, other materials may also be used.

Figure 3A:
FIGS. 3A-3J show cross-sectional views of a sequential process flow of forming a die package, in accordance with some embodiments.
Figure 3B:
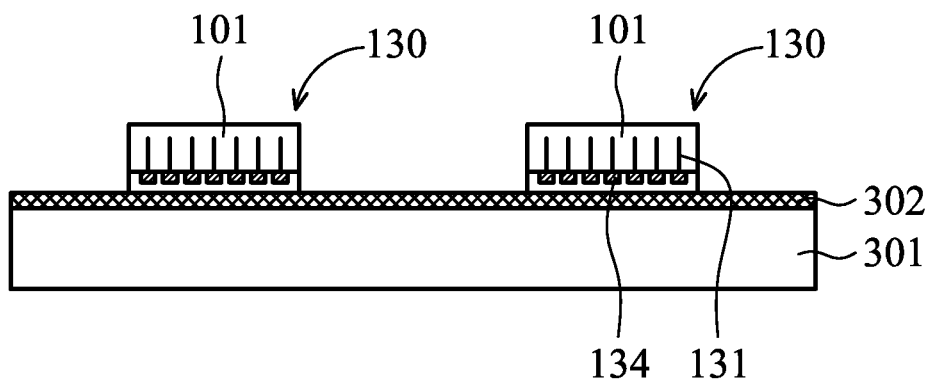
Figure 3C:
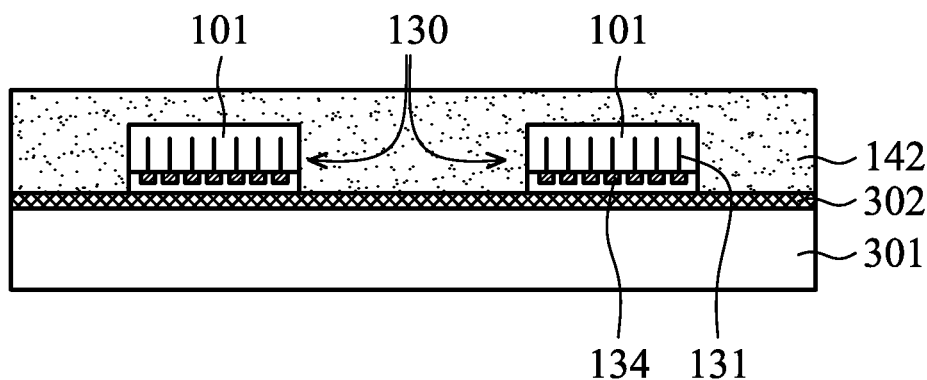

FIGS. 3A-3J show cross-sectional views of a sequential process flow of forming a die package 100*, in accordance with some embodiments. FIG. 3A shows an adhesive layer 302, which is over a carrier 301. Carrier 301 is made of glass, in accordance with some embodiments. However, other materials may also be used for carrier 301. Adhesive layer 302 is deposited or laminated over carrier 301, in some embodiments. Adhesive layer 302 may be formed of a glue, or may be a lamination layer formed of a foil. Afterwards, dies 130 are placed over adhesive layer 302, as shown in FIG. 3B in accordance with some embodiments. The side with connection structures 134 faces adhesive layer 302. Dies 130 adhere to adhesive layer 302. Afterwards, molding compound 142 is formed over dies 130, as shown in FIG. 3C in accordance with some embodiments.

The formation of the molding compound 142 involves depositing a liquid molding compound on adhesive layer 302 to cover dies 130 and performing a thermal reflow, in some embodiments. For example, the liquid molding compound could be monomers or not-fully linked polymers. The thermal reflow polymerizes the monomers and/or non-fully linked polymers in the liquid molding compound to become solid molding compound 142. The thermal reflow may also evaporate solvent used in forming the liquid molding compound.

Figure 3D:
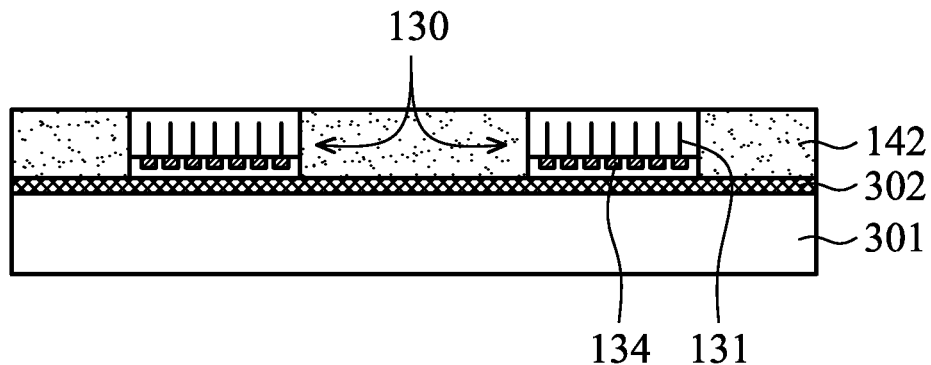
Figure 3E:
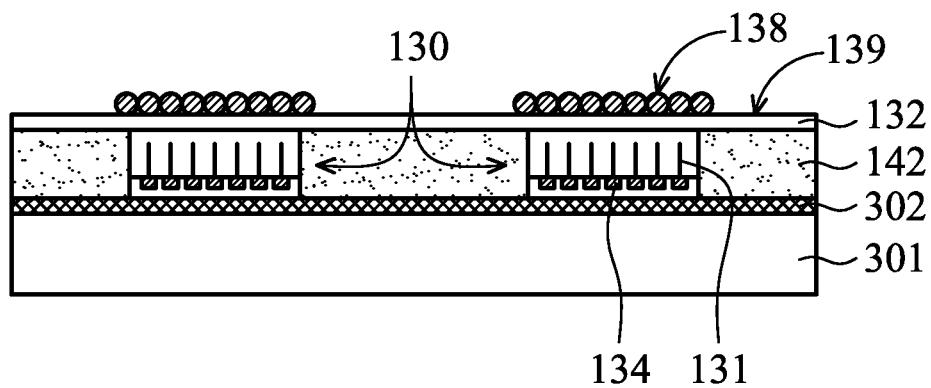

Afterwards, excess molding compound 142 and a portion of substrate 101 are removed to expose TSVs 131 on die 130, as shown in FIG. 3D in accordance with some embodiments. The removal process could be grinding, polishing, or other applicable process. After the excess molding compound 142 is removed, redistribution structure 132 and bump structures 138 are formed over surface 139 of exposed TSVs 131, as shown in FIG. 3E in accordance with some embodiments. As mentioned above, redistribution structure 132 includes layers RDLs to enable fan-out for dies 130 and also dies bonded to dies 130, such as dies $120_A$*. Redistribution structure 132 also includes dielectric layer(s), which is protects and isolate RDLs. Bump structures 138 are formed over redistribution structure 132 to enable connecting die 130 to other die(s). Bump structures 138 may be solder bumps, copper posts, or other applicable bump structures. In some embodiments, bump structures 138 are microbumps with widths in a range from about 5 μm to about 30 μm.

Exemplary bump structures 138 are also described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 3F:
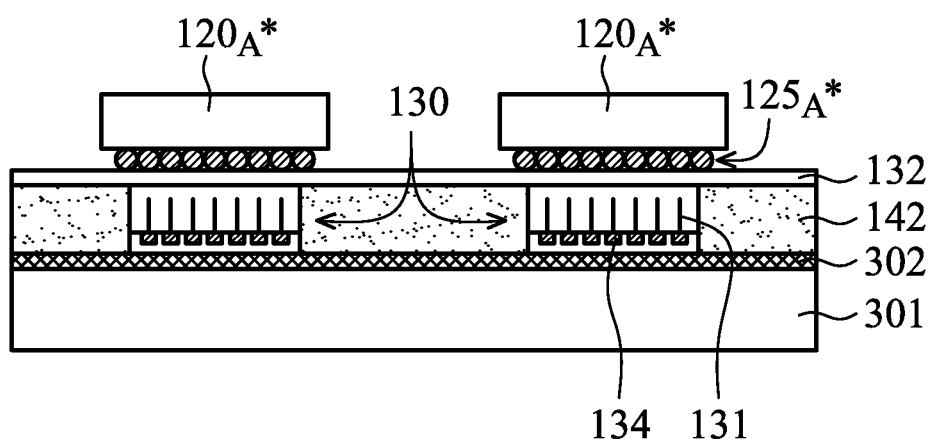

Following the formation of redistribution structure 132 and bump structures 138, dies 120$_A$* are placed over redistribution structure 132 and bump structures 138 of dies 130, as shown in FIG. 3F in accordance with some embodiments. The bump structures (not shown) of dies 120$_A$* are aligned with bump structures 138 of die 130. In some embodiments, a flux (not shown) is applied over the redistribution structure 132 and the bump structures 138 prior to placing dies 120$_A$* over them. The flux prevents oxidation of the bump structures 138 and also enables the placement of dies 120$_A$* over die 130. In some embodiments, a thermal reflow is performed to form bonding structures 125$_A$* between die 120$_A$* and die 130. Bonding structures 125$_A$* are formed by bonding the bump structures of dies 120$_A$* with bump structures 138 of die 130. FIG. 3F shows that die 120$_A$* is wider than die 130.

If an underfill 144 is formed in the space between dies 120$_A$* and 130, as shown in FIG. 1B, an underfill material is applied after bonding structures 125$_A$* are formed. The underfill material is then hardened by a thermal process to form underfill 144. However, as mentioned above, the formation of underfill 144 is optional.

Figure 3G:
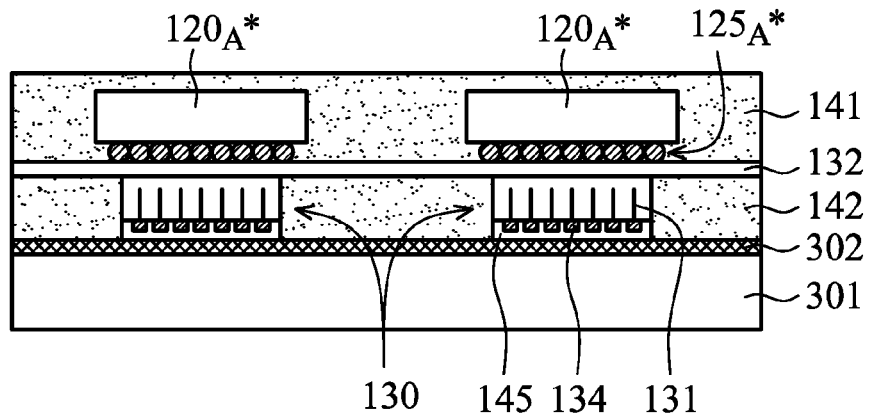

After the bonding structures 125$_A$* or underfill 144 are formed, molding compound 141 is formed to cover dies 120$_A$*, as shown in FIG. 3G in accordance with some embodiments. The formation method of molding compound 141 is similar molding compound 142. If underfill 144 is not used, the reflow process to form bonding structures 125$_A$* is skipped, in some embodiments. The thermal process used to harden molding compound 141 may also be used as a reflow process for forming the bonding structures 125$_A$*. The molding compound 141 used for package 100* without underfill 144 is a molding underfill (MUF) material. FIG. 3G shows a molding compound 141 formed over dies 120$_A$* and redistribution structure 132, in accordance with some embodiments.

Figure 3H:
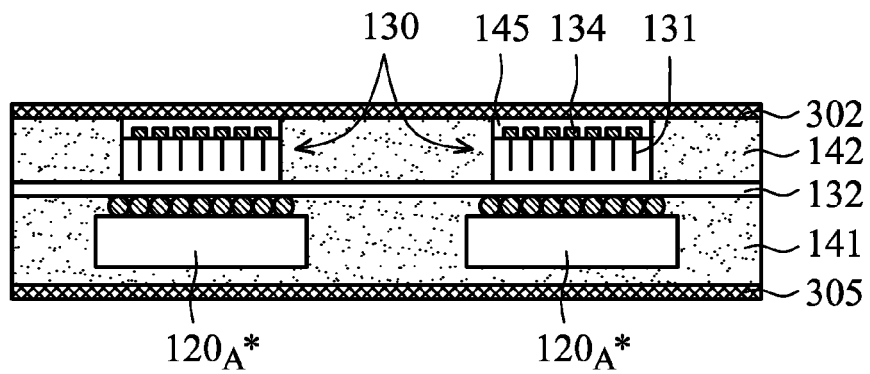
Figure 3I:
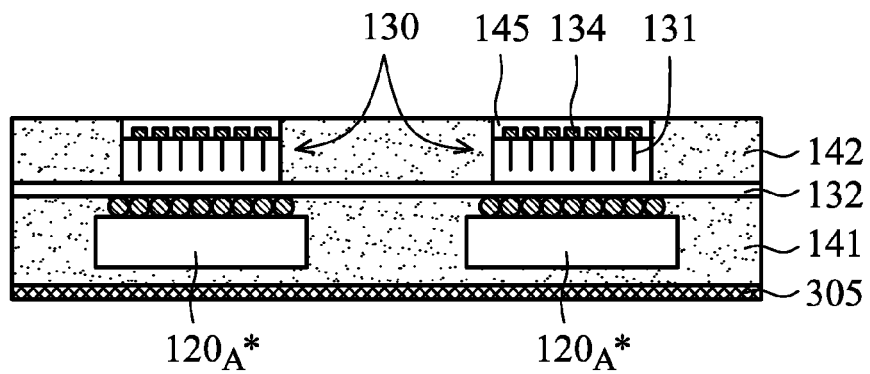

After molding compound 141 is formed, carrier 301 is removed in preparation for singulation of the packaged structures into individual packages 100*. The packaged structure after the carrier 301 is removed is then turned up-side-down and secured to a tape 305, as shown in FIG. 3H in accordance with some embodiments. The excess molding compound 142 and a portion of the protective layer 145 covering the connection structures 134 are removed to expose connection structures 134, as shown in FIG. 3I in accordance with some embodiments. The removal process used may be a grinding process, a polishing process, or an etching process. After the removal process, the remaining portion of the protective layer 145 surrounds the connection structures 134, as shown in FIGS. 3I and 1A, in accordance with some embodiments.

Figure 3J:
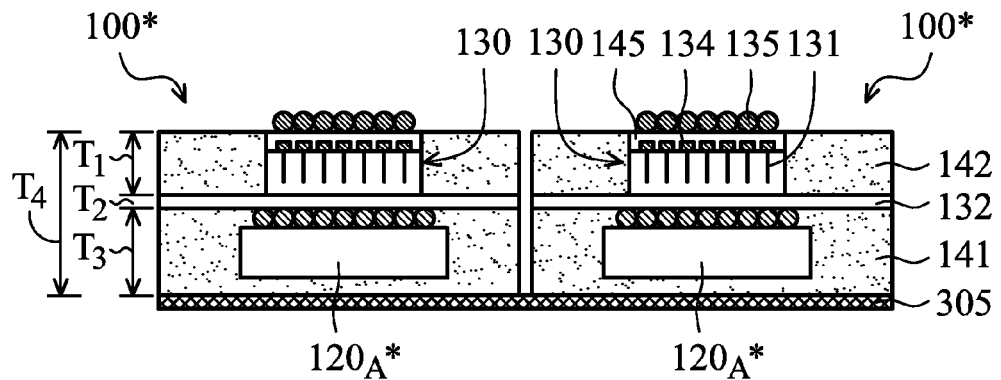

After the connection structures 134 are exposed, external connectors 135, such as solder balls, are placed (or mounted) on connection structures 134. A reflow process is then performed to bond the external connectors 135 to the connection structures 134. A sawing process is then performed to singulate packages into individual package 100*. FIG. 3J shows singulated packages 100* attached to tape 305, in accordance with some embodiments. After package singulation, tape 305 is removed and package 100* is formed. The form factor of package 100* is adequate (i.e. thickness of package 100* is low). The total thickness of package 100*, $T_4$, is in a range from about 90 μm to about 500 μm in some embodiments. The thickness of die 130, $T_1$, is in a range from about 30 μm to about 100 μm in some embodiments. The thickness of die 120$_A$*, $T_3$, is in a range from about 50 μm to about 300 μm in some embodiments. The thickness of the redistribution structure 132, $T_2$, is in a range from about 3 μm to about 20 μm in some embodiments. Further, the process flow of forming package 100* is simple.

Figure 3K:
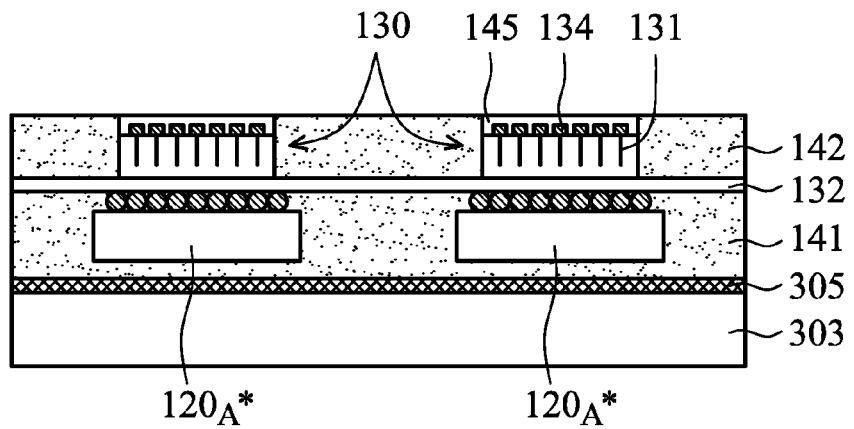
FIGS. 3K-3N show cross-sectional views of a sequential process flow of forming interconnections over connection structures of a package structure, in accordance with some embodiments.
Figure 3L:
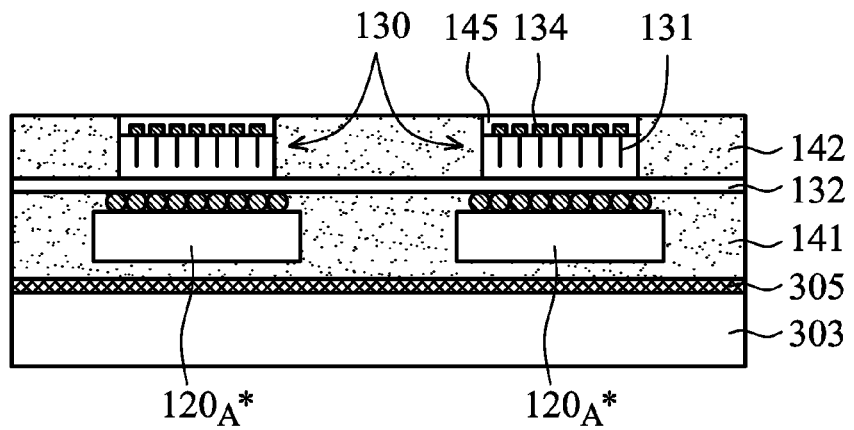

The structures and sequential process flow described above in FIGS. 3A-3J illustrate an exemplary approach to form a package 100* shown in FIG. 1C. In some embodiments, additional interconnections or redistribution structure(s) would need to be formed over connection structures 134 of die 130 to enable routing and bonding for different applications. FIGS. 3K-3N show cross-sectional views of a sequential process flow of forming interconnections over connection structures 134 of die 130 to form packages 100', in accordance with some embodiments. Process sequence of FIGS. 3K-3N continues after the processes described in FIG. 3G. After molding compound 141 is formed as shown in FIG. 3G, carrier 301 and adhesive layer 302 are removed. The package structure of FIG. 3G is attached to an adhesive layer 304, which is attached to a different carrier 303 as shown in FIG. 3K in accordance with some embodiments. As shown in FIG. 3K, the packaged structure after the carrier 301 and adhesive layer 302 are removed is then turned up-side-down and secured to adhesive layer 304. A portion of the protective layer 145 covering the connection structures 134 is then removed to expose connection structures 134, as shown in FIG. 3L in accordance with some embodiments. A portion of molding compound 142 surrounding the portion of the protective layer 145 removed is also removed. The removal process used may be a grinding process, a polishing process, or an etching process. The remaining portion of protective layer 145 surrounds the connection structures 134.

Figure 3M:
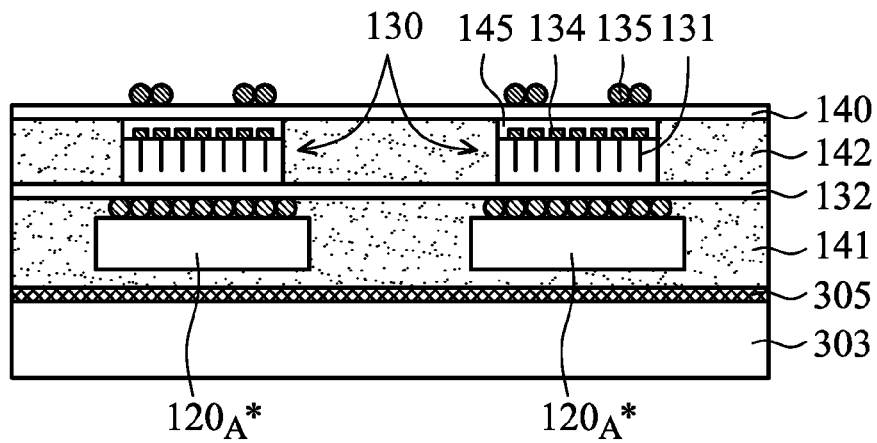

After the connection structures 134 are exposed, a redistribution structure 140 is formed cover the surface of packaged die 130, as shown in FIG. 3M. Redistribution structure 140 includes layers RDLs (or RDL), which enable reconfiguration of bonding structures (not shown), such as bond pads, for external connectors 135 (e.g., contacts) and could also enable fan-out for dies 130 on this side of each die 130 (i.e., an opposite side of the redistribution structure 132). Redistribution structure 140 also includes dielectric layer(s), which is protects and isolate RDLs. After the redistribution structure 140 is formed, external connectors 135 are mounted on bonding pads on the redistribution structure 140, as shown in FIG. 3M in accordance with some embodiments.

Figure 3N:
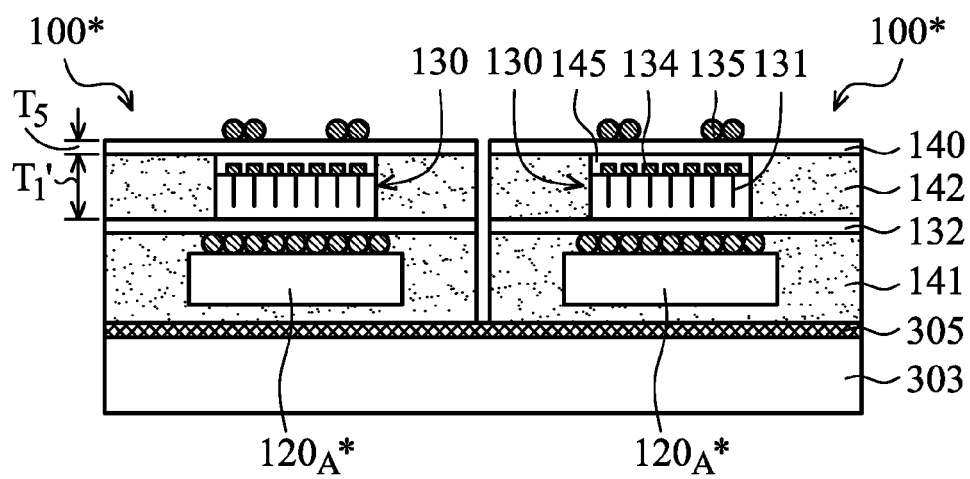

Afterwards, carrier 303 and adhesive layer 304 are removed and be attached to a tape 141 to undergo a sawing process to singulate packages 100'. FIG. 3N shows singulated packages 100' attached to tape 146, in accordance with some embodiments. After package singulation, tape 146 is removed and package 100' is formed. The thickness of die 130 with redistribution structure 140, $T_1'$, is in a range from about 30 μm to about 100 μm in some embodiments. The thickness of redistribution structure 140, $T_5$, is in a range from about 3 μm to about 20 μm in some embodiments.

Figure 4:
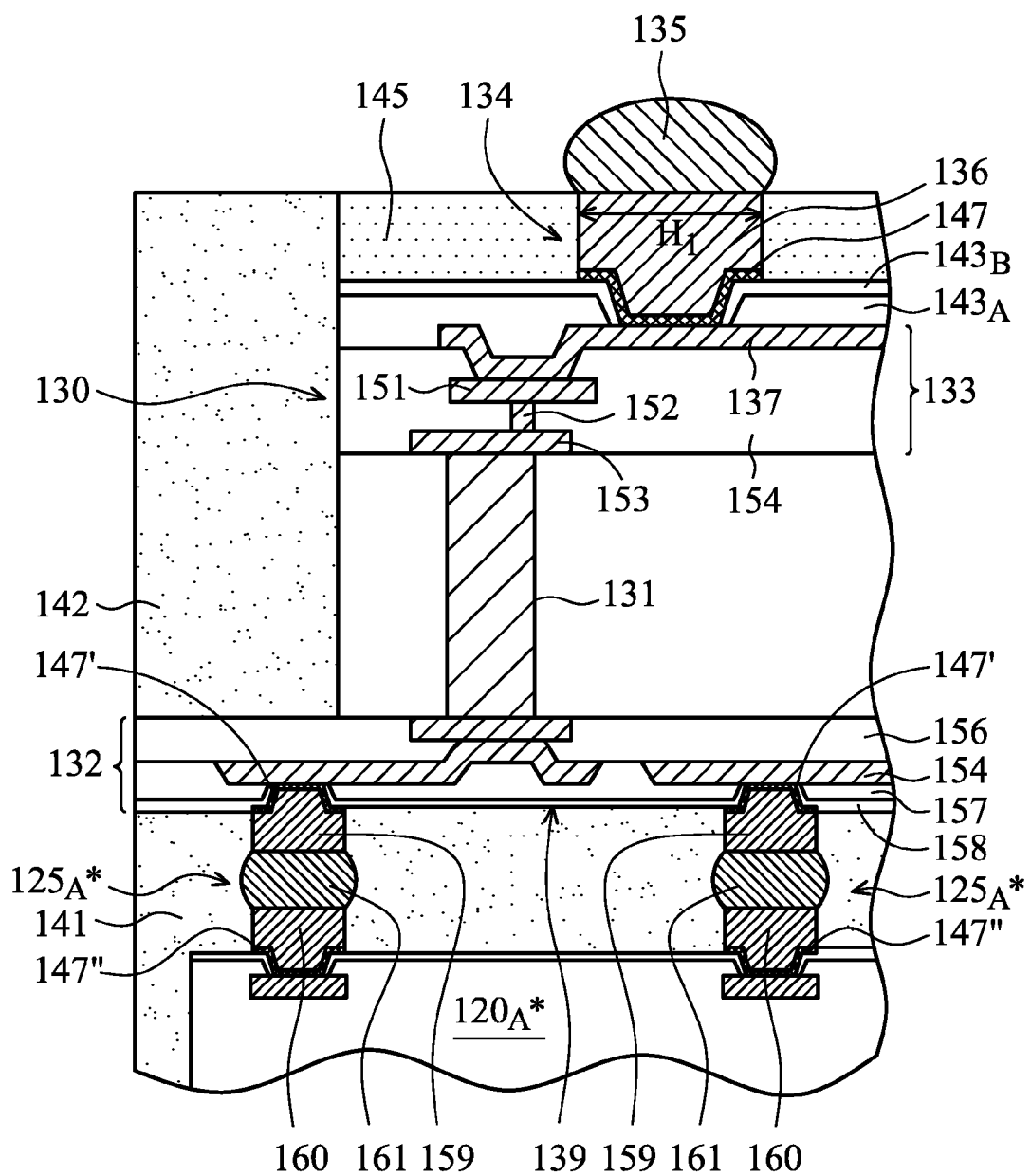
FIG. 4 shows a close up, more detailed view of a portion of a package, in accordance with some embodiments.

FIG. 4 shows a close up, more detailed view of a portion of a package 100\*, in accordance with some embodiments. FIG. 4 shows an edge portion of die 130 bonded to die 120$_A$\*. As shown in FIG. 4, external connectors 135, such as solder bumps, for die 130 are bonded to metal posts 136, which are bonded to metal pads 137 via an under bump metallurgy (UBM layer) 147. In some embodiments, a width $H_1$ of metal post 136 is in a range from about 60 μm to about 320 μm. The metal pad 137, UBM layer 147, metal post 136 form connection structures 134, which are isolated from one another by dielectric layers 143$_A$ and 143$_B$, in accordance with some embodiments. The connection structures 134 are surrounded by (or embedded in) a protective layer 145, in accordance with some embodiments. Dielectric layers 143$_A$ and 143$_B$ are made of polymers, in accordance with some embodiments. FIG. 4 also shows TSVs 131 and interconnect structure 133 formed over TSVs 131 of die 130. Interconnect structure 133 includes metal layers 137, 151, and 153, and also via 152, which are insulated by dielectric layer(s) 154. The interconnect structure 133 shown in FIG. 4 is merely an example. There could be additional metal and via layers in the structure.

In some embodiments, the UBM layer 147 includes a diffusion barrier layer and a seed layer. The diffusion barrier layer may also function as an adhesion layer (or a glue layer), in some embodiments. The diffusion barrier layer may be made of Ta, TaN, Ti, TiN, or combination thereof. The seed layer is made of a material to enable deposition of metal posts 146. In some embodiments, the UBM layer 147 includes a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) (or sputtering) methods.

FIG. 4 also shows redistribution structure 132, which includes RDL 154 formed over a metal layer 155, which is connected to TSV 131. RDL 154 enables fan-out for die 130, and one of the bonding structures 125$_A$\* between dies 130 and 120$_A$\* is outside the edge of die 130. Each bonding structures 125$_A$\* includes UBM layers 147' and 147", metal posts 159 and 160, and also a bonded solder layer 161, in accordance with some embodiments. In some embodiments, a width $H_2$ of metal posts 159 of bonding structures 125$_A$\* is in a range from about 5 μm to about 40 μm. Metal posts 159 and metal posts 160 have about the same widths in some embodiments.

RDL 154 is insulated by dielectric layers 156, 157, and 158. In some embodiments, dielectric layers 156, 157 and 158 are passivation layers and are made of polymers. The redistribution structure 132 shown in FIG. 4 is merely an example. There could be additional metal and dielectric layers in the structure to enable interconnection and fan-out.

Details of various exemplary structures of packaged die 130 can be found in U.S. patent application Ser. No. 13/619, 877, entitled "3DIC Stacking Device and Method of Manufacture," filed on Sep. 14, 2012, which is incorporated herein by reference in its entirety.

Various embodiments of mechanisms for forming a package with one or more dies over an interposer are provided. By forming a redistribution structure over the interposer with TSVs, the die(s) bonded to the interposer can have edge(s) beyond a boundary of the interposer. In addition, another redistribution structure may be formed on the opposite surface of the interposer from the redistribution structure. The other redistribution structure enables reconfiguration and fan-out of bonding structures for external connectors of the interposer.

In some embodiments, a method of forming a semiconductor package is provided. The method comprises placing an interposer with one or more through-substrate-vias (TSVs) on a first adhesive layer overlying a first carrier substrate, wherein connection structures are arranged along a first surface of the interposer facing the first adhesive layer. The method further comprises forming a first molding compound over the first adhesive layer and surrounding the interposer, wherein the first molding compound is arranged to expose the TSVs along a second surface of the interposer. The method further comprises forming a first redistribution structure over the second surface of the interposer and the first molding compound, and forming conductive bump structures over the first redistribution structure. The method further comprises bonding a first packaged die to the conductive bump structures.

In some other embodiments, a method of forming a semiconductor package is provided. The method comprises placing an interposer with one or more TSVs on an adhesive layer overlying a carrier substrate, wherein connection structures are arranged along a first surface of the interposer facing the adhesive layer. The method further comprises forming a first molding compound surrounding the interposer, wherein the first molding compound is arranged to expose the TSVs along a second surface of the interposer. The method further comprises forming conductive bump structures over the second surface of the interposer, wherein the conductive bump structures are electrically coupled to the TSV. The method further comprises bonding a first packaged die to the conductive bump structures, wherein an edge of the first packaged die is beyond an edge of the interposer. The method further comprises removing the carrier substrate and the adhesive layer.

In yet some embodiments, a method of forming a semiconductor package is provided. The method comprises placing an interposer with one or more TSVs on an adhesive layer overlying a carrier substrate, wherein connection structures are arranged along a first surface of the interposer facing the adhesive layer. The method further comprises forming a first molding compound surrounding the interposer, wherein the first molding compound is arranged to expose the TSVs along a second surface of the interposer. The method further comprise forming a plurality of conductive bump structures, which are electrically coupled to the TSV, over the second surface of the interposer. The method further comprises bonding a first packaged die to a first set of the plurality of conductive bump structures, so that one edge of the first packaged die is beyond a first edge of the interposer. The method further comprises bonding a second packaged die to a second set of the plurality of conductive bump structures, so that one edge of the second packaged die is beyond a second edge of the interposer opposite the first edge.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor package, comprising:
    placing an interposer with one or more through-substrate-vias (TSVs) on a first adhesive layer overlying a first carrier substrate, wherein connection structures are arranged along a first surface of the interposer facing the first adhesive layer;
    forming a first molding compound over the first adhesive layer and the interposer, and laterally surrounding the interposer;
    removing a portion of the first molding compound to expose the TSVs along a second surface of the interposer;
    forming a first redistribution structure over the second surface of the interposer and the first molding compound;
    forming conductive bump structures over the first redistribution structure; and
    bonding a first packaged die to the conductive bump structures.

2. The method of claim 1, further comprising:
    forming a second molding compound over the first redistribution structure and the first packaged die.

3. The method of claim 2, further comprising:
    removing the first carrier substrate and the first adhesive layer;
    attaching the second molding compound to a second carrier substrate by way of a tape that is separated from the first redistribution structure by the first packaged die;
    removing a portion of a protective layer, which is located on the first surface of the interposer, to expose the connection structures of the interposer; and
    forming external connectors over the connection structures of the interposer.

4. The method of claim 2, further comprising:
    removing the first carrier substrate and the first adhesive layer to expose the connection structures of the interposer.

5. The method of claim 4, further comprising:
    forming a second redistribution structure electrically coupled to the connection structures of the interposer and separated from the first redistribution structure by way of the first molding compound.

6. The method of claim 5, further comprising:
    attaching the second molding compound to a second carrier die by way of a second adhesive layer prior to forming the second redistribution structure.

7. The method of claim 1, further comprising:
    forming an underfill laterally surrounding the conductive bump structures at a position vertically between the first packaged die and the first redistribution structure.

8. The method of claim 1, wherein the first packaged die has a sidewall that is laterally offset from a sidewall of the interposer.

9. The method of claim 1, further comprising:
    bonding a second packaged die bonded to the first redistribution structure, wherein the first packaged die is separated from the second packaged die by a space that is free of the first packaged die.

10. The method of claim 1, further comprising:
    removing a portion of the interposer to expose the TSVs along the second surface of the interposer.

11. The method of claim 10, wherein removing the portion the first molding compound is performed by a grinding process, a chemical-mechanical polishing process, or an etching process.

12. A method of forming a semiconductor package, comprising:
    placing an interposer with one or more TSVs on an adhesive layer overlying a carrier substrate, wherein connection structures are arranged along a first surface of the interposer facing the adhesive layer;
    forming a first molding compound surrounding the interposer, wherein the first molding compound is arranged to expose the TSVs along a second surface of the interposer;
    forming conductive bump structures over the second surface of the interposer, wherein the conductive bump structures are electrically coupled to the TSVs;
    bonding a first packaged die to the conductive bump structures, wherein an edge of the first packaged die is beyond an edge of the interposer; and
    removing the carrier substrate and the adhesive layer.

13. The method of claim 12, further comprising:
    bonding a second packaged die to the conductive bump structures, wherein the first packaged die is separated from the second packaged die by a space that is free of the first packaged die.

14. The method of claim 12, further comprising:
    forming a first redistribution structure over the second surface of the interposer and the first molding compound; and
    forming the conductive bump structures over the first redistribution structure at locations laterally offset from the interposer.

15. The method of claim 12, further comprising:
    forming at least one metal post on the first surface of the interposer, wherein the at least one metal post is electrically connected to a TSV of the one or more TSVs.

16. The method of claim 15, further comprising:
    forming a protective layer surrounding sidewalls of the at least one metal post, wherein the protective layer laterally separates the at least one metal post from the first molding compound.

17. A method of forming a semiconductor package, comprising:
    placing an interposer with one or more TSVs on an adhesive layer overlying a carrier substrate, wherein connection structures are arranged along a first surface of the interposer facing the adhesive layer;
    forming a first molding compound surrounding the interposer, wherein the first molding compound is arranged to expose the TSVs along a second surface of the interposer;
    forming a plurality of conductive bump structures, which are electrically coupled to the TSVs, over the second surface of the interposer;

bonding a first packaged die to a first set of the plurality of conductive bump structures, so that one edge of the first packaged die is beyond a first edge of the interposer; and bonding a second packaged die to a second set of the plurality of conductive bump structures, so that one edge of the second packaged die is beyond a second edge of the interposer opposite the first edge.

18. The method of claim 17, further comprising:

forming a second molding compound over the interposer, the first packaged die, and the second packaged die.

19. The method of claim 17, further comprising:

removing the carrier substrate and the adhesive layer to expose the connection structures along the first surface of the interposer.

20. The method of claim 17, further comprising:

forming the first molding compound over the interposer and over the adhesive layer; and removing a portion the first molding compound and a portion of the interposer to expose the TSVs along the second surface of the interposer.

* * * * *